March 25, 1958 G. A. KWASNIEWSKI 2,827,634

SUPPORTING AND CRIMPING MECHANISM

Filed Nov. 10, 1955 3 Sheets-Sheet 1

INVENTOR.
GEORGE A. KWASNIEWSKI
BY
William C. Stueber
ATTORNEY

March 25, 1958 G. A. KWASNIEWSKI 2,827,634

SUPPORTING AND CRIMPING MECHANISM

Filed Nov. 10, 1955 3 Sheets-Sheet 2

INVENTOR.
GEORGE A. KWASNIEWSKI
BY
William C. Stueber
ATTORNEY

INVENTOR.
GEORGE A. KWASNIEWSKI
BY
William C. Stueber
ATTORNEY

United States Patent Office 2,827,634
Patented Mar. 25, 1958

2,827,634

SUPPORTING AND CRIMPING MECHANISM

George A. Kwasniewski, Minneapolis, Minn., assignor to General Mills, Inc., a corporation of Delaware Application November 10, 1955, Serial No. 547,883

5 Claims. (Cl. 1—102)

The present invention relates to improvements in mechanisms for attaching electrical components to circuit boards and crimping the leads of the components beneath the board. More specifically the invention relates to mechanisms for aiding in the attachment of a component by supporting the board while the leads are being inserted into holes in the board, sensing whether the leads are completely inserted, and crimping the leads after insertion.

In the art of automatic mechanical assembly of electrical circuitry electrical components such as resistors and condensers are attached to printed circuit boards by having their leads bent downwardly toward the board and inserted into holes in the board. The ends of the leads which project through the board are then crimped or bent against the lower surface of the board and later soldered to the conducting lines in the circuit board.

The circuit boards are of the type generally referred to as printed circuit boards being formed of a non-conducting material with lines of conducting material formed on the board by printing, etching, or embedding in the surface of the conducting material and the conducting lines terminating at holes. The terminals or leads of electrical components are inserted into the holes to make electrical contact with the conducting lines thus completing the circuitry of the board.

In the mechanical assembly of the circuits it is desirable that the machine operate at a relatively high speed. It will be seen that accuracy of insertion is important since the leads must be rapidly inserted into holes in which they form a snug fit. As well as accomplishing the attachment of components to boards quickly and accurately it is important that each of the connections be complete since a defective connection will destroy the functional, ability of the entire circuit.

It is important in inserting and attaching the components that the leads be completely inserted through the hole and that they be accurately crimped. It is also important to good insertion that the board be held firmly so that as the lead is brought downwardly through the hole the board does not bend to permit the board or lead to be deflected or to prevent the lead from being fully inserted.

It is accordingly an object of the present invention to provide a mechanism which is capable of operation with high speed circuit assembling apparatus which will provide a firm support for the board while the component leads are being inserted.

Another object of the invention is to provide a mechaanism which is capable of sensing whether or not a complete insertion of the lead into the circuit board hole has been completed and which will prevent the continued operation of the machine in the event an incompleted insertion is made so that the operator can rectify the error and insure that the board will have a complete operative circuit.

Another object of the invention is to provide an improved crimping mechanism which will surely and accurately crimp the ends of the leads beneath the board.

Another object is to provide an improved elevating apparatus which functions to lift the board support, crimpers, and lead sensing mechanism to an operating position beneath the board as each individual board is brought into inserting position.

Other objects and advantages will become more apparent in the following specification and claims taken in connection with the appended drawings in which:

Figure 1:
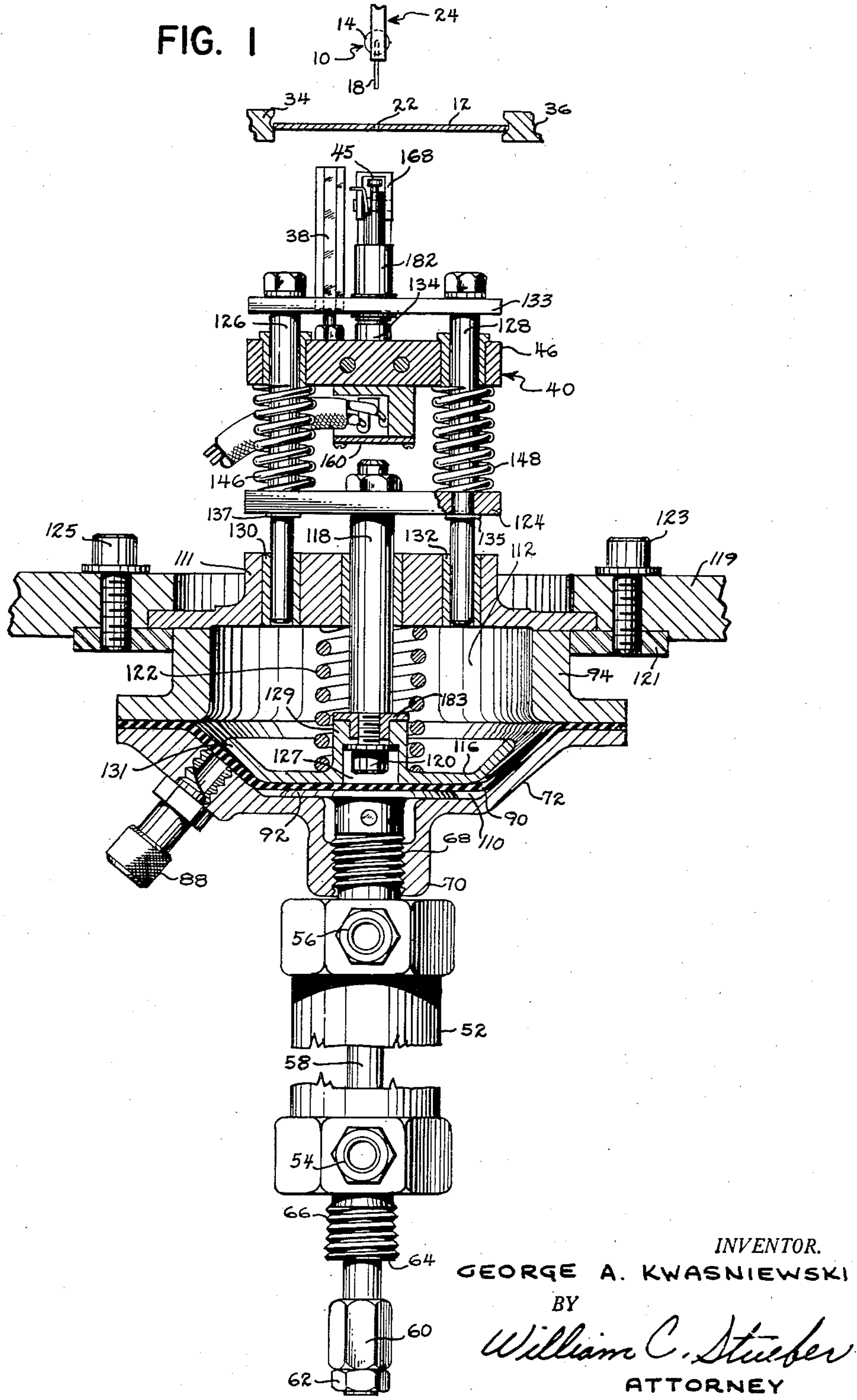
Figure 1 is a side elevational view of the mechanism for supporting the circuit boards, sensing the proper insertion of the leads, and crimping the leads.

The mechanism illustrated in the drawings which is the preferred embodiment of the invention is shown as operating to attach a component 10 to a circuit board 12. Although the component shown is a tubular type having a tubular body 14 with leads 16 and 18 extending from the end, other types of components may be handled by the mechanism. The component shown may be a resistor or a condenser and in attaching the component to the board the leads are bent downwardly to the shape shown in Fig. 2 and inserted into holes 20 and 22 in the circuit board in the manner shown in Fig. 3.

The inserting mechanism is shown generally at 24 and comprises a pair of inserting fingers 26 and 28 which have grooves 30 and 32 at their lower ends for holding the leads of the components therebetween. Various types of inserting mechanism may be used and this mechanism is not shown in detail but may be of the type illustrated in the co-pending application Machine for Assembling Circuit Components, Bergsland et al., Serial No. 488,232, filed February 15, 1955.

In a machine of this type, the leads of the component are bent downwardly toward the circuit board and the component is then carried toward the board and the leads inserted into the holes in the board. The board is supported in the inserting position in such a manner that the holes 20 and 22 are in proper alignment for insertion of the leads 16 and 18. As shown in the drawings, the board may be supported by a pair of guides 34 and 36. These guides may take the form of tracks or rails with the circuit board 12 being pushed along the tracks to a series of attaching stations where other components are also attached to different holes in the circuit board.

As shown in Fig. 1 the board 12 is unsupported at the center. These boards are generally made of a nonconductive plastic resin type of material having holes punched in the surfaces into which the leads of the components are inserted. The boards contain conducting material either printed, sprayed, embedded, or otherwise attached to the surface and the conducting material forms a circuit network which is completed when the electrical components are attached thereto. For the above functions, the circuit board need only be thick enough to insure that the conductive areas are adequately supported. It will be noted from the drawing that when a circuit board of any size is used, there is a considerable span between the edge supports 34 and 36 and as the leads are inserted into the holes of the board the board will bend downwardly from the friction of the leads entering the holes. Also in some inserting mechanisms the inserting fingers 26 and 28 bear against the board.

To stabilize the board and prevent it from being displaced downwardly, the present mechanism provides a support 38 which is raised up beneath the board to prevent it from bowing downwardly from pressures from above. The support 38 is carried on an elevator platform shown generally at 40 in the drawings. The elevator platform is lifted up beneath the board to hold the support 38 beneath the board and it also moves the crimping mechanism shown generally by the fingers 168 and 169 into position beneath the board where it is in a location to engage the leads and bend them over beneath the board. Also carried on the elevator 40 and moved into operating position when the elevator lifts up beneath the board are the lead sensors which are indicated generally by the plungers 44 and 45, Fig. 2. These sensor plungers 44 and 45 sense when a lead has been projected through a hole in the board and if the lead is improperly inserted or not inserted at all the sensors will stop the operation of the machine.

Generally, the mechanism as shown in Figs. 1 through 4 consists of the elevator which carries the support mechanism 38, the crimping mechanisms 142 and 144 and the lead sensors 44 and 45. Also included in the present invention is the mechanism for lifting the elevator and for operating various elements as previously described.

The mechanism which functions to lift the elevator 40 into its up position beneath the board will first be described. The elevator includes an elevator plate 46 to which the support 38 is connected. The elevator plate 46 carries a threaded hole into which is threaded the lower end 48 of the support column 38. The threaded lower end 48 carries a lock nut 50 which is threaded down against the upper surface of the plate 46 when the column is adjusted to the right position. This position is adjusted after the elevator plate 46 reaches its uppermost position.

The uppermost position of this plate is generally fixed but can be adjusted within limits. The adjustment, however, to which the plate must be set is dependent upon the necessary uppermost position of the crimping elements 142 and 144. When this uppermost position is adjustably fixed, the elevator will be in the position of Fig. 2 which is its first raised position. The support column 38 is then adjusted by threading it upwardly or downwardly so that it just engages the lower surface of the circuit board 12 to provide a support therefore. When the proper adjustment is made the lock nut 50 is screwed down upon the upper surface of the elevator plate 46 to thus lock the support column 38 in its adjusted position. Thus, when the elevator is in the uppermost position as shown in Fig. 2, the upper end of the support column 38 will just engage the lower surface of the board to prevent the board from bowing downwardly from a force on top of the board.

Figure 2:
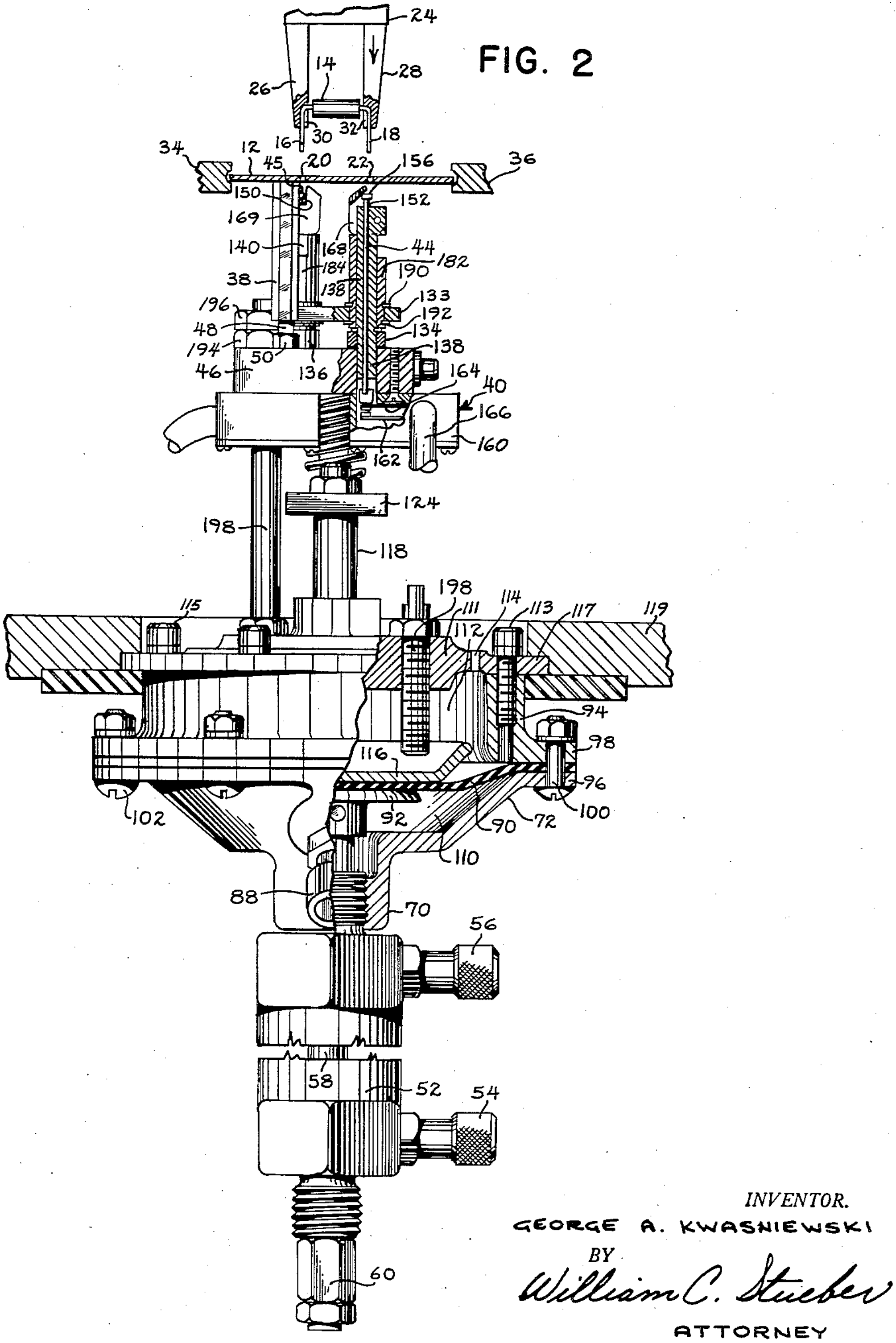
Figure 2 is a front elevational view of the mechanism of Figure 1 with portions broken away to illustrate the internal structure of the device.

An air cylinder 52 is provided to raise the elevator 40 to its first raised position or from the position of Fig. 1 to Fig. 2. In the first position of the elevator assembly the elevator plate 46 reaches its uppermost position and in the second position of the elevator assembly the plate 46 and the support 38 raise no further but certain other elements raise to a higher position to operate the crimpers. The air cylinder has a lowermost air inlet 54 and an upper air inlet 56 which connect to air lines to control the flow of air into the cylinder 52 and thus control the position of the elevator 40. Within the cylinder 52 is a piston which is secured to the piston rod 58 which extends completely through the cylinder. Suitable packings are supplied at each end of the cylinder to prevent air from leaking past the piston rod.

At the lower end of the piston rod 58 is an adjustable stop nut 60 which is threaded to the piston rod 58. A lock nut 62 is also provided to fix the position of the adjustable nut 60. This adjustable stop nut 60 strikes the lower surface 64 of the threaded end 66 which extends outwardly beyond the lower end of the piston. As the piston is raised from the position of Fig. 1 to Fig. 2, it will be noted that the stop nut 60 strikes this lower surface 64 to prevent the piston rod from moving any further upwardly. It will be noted that the projecting end 64 is threaded and a similar end 68 projects from the top of the piston and is also threaded. This threaded end is screwed into a female threaded annular flange 70 projecting downwardly from the hollow bell-shaped casting 72. Since the cylinder 52 is symmetrical the cylinder is reversible and either end may be threaded into the flange 70.

In order to raise the piston and rod 58 to thereby lift the elevator, air is admitted through the lower connection 54 and the upper connection 56 is vented to atmosphere thus moving the piston rod 58 upwardly. The air which controls the position of the piston is supplied through air supply lines and a valve as shown in diagrammatic form in Fig. 6. The air supply line 74 leads from a pressurized air supply to the air control valve 76. This control valve has a plunger 78 which is depressed or released to control the flow of air to the lines 56 and 54 which connect to the piston cylinder 52. When the lower line 54 is pressurized and the upper line 56 is vented, the piston rod 58 will raise to the position of Fig. 2 thus raising the elevator 40 to the position of Fig. 2. When the lower line 54 is vented and the upper line 56 is pressurized, the piston 58 will descend to lower the rod 58 to the position of Fig. 1.

Figures 3, 4, 5, 6:
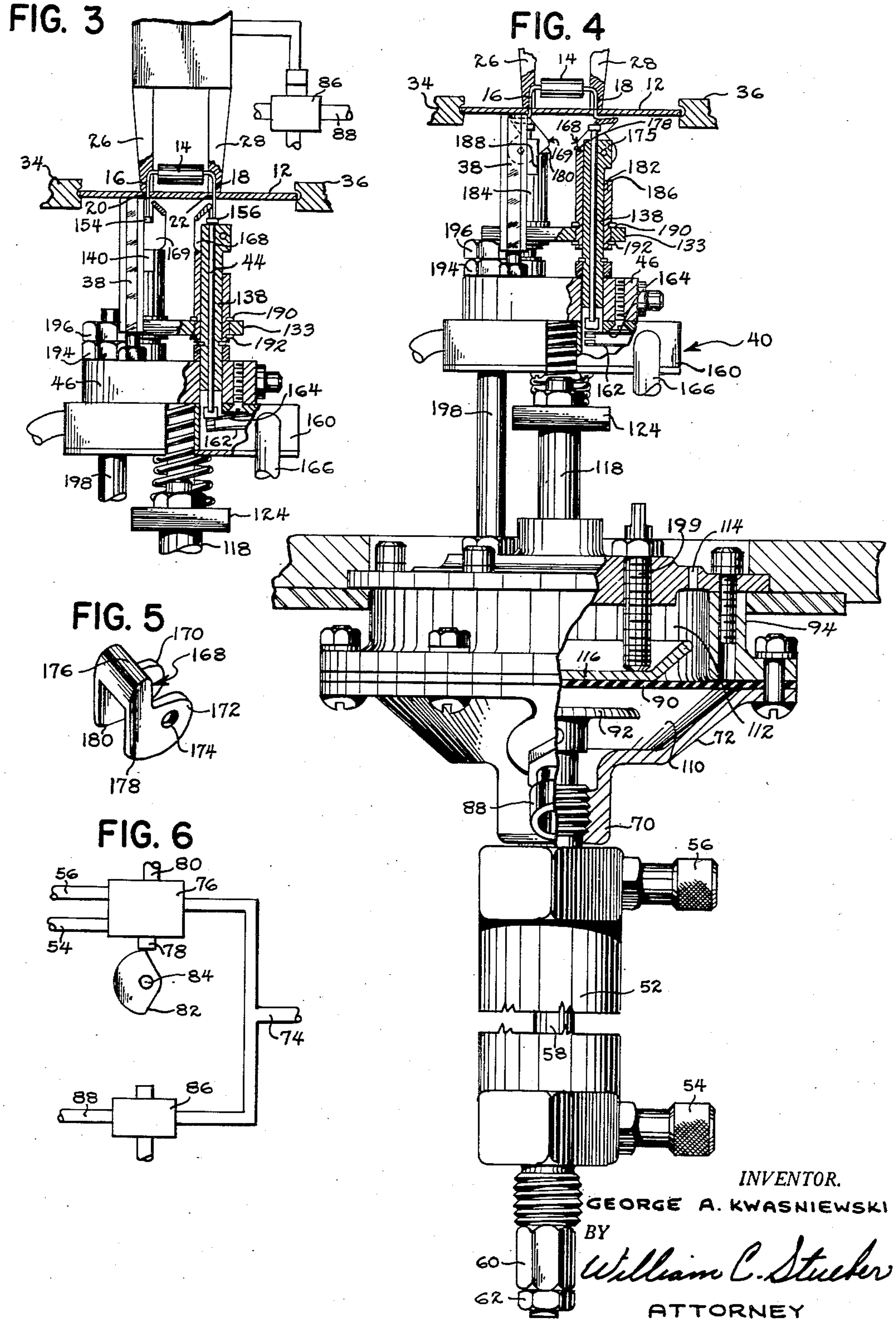
Figure 3 is a detailed view of a portion of the machine illustrating the leads being inserted into the board and the operation of the lead sensors.
Fig. 4 is a front elevational view of the machine showing the leads being crimped.
Fig. 5 is an enlarged detailed perspective view of one of the crimping elements.
Fig. 6 is a schematic illustration of the valves for controlling the air supply.

The air line 74 also connects to a second control valve 86 which connects through line 88, as shown in Figs. 1, 2, and 6, to control the supply of air to operate the diaphragm 90 which raises the elevator mechanism to its second position.

To raise the elevator 40, pressurized air is admitted to the lower line 54 and the circuit board support 38 is raised to position shown in Fig. 2. To raise the elevator, the piston rod 50 carries a mushroom-shaped plate 92 secured to its upper end. This flange has a flat upper surface which bears against the lower face of a flexible diaphragm 90.

The diaphragm 90 is circular in shape and is secured at its edges between the bell-shaped casting 72 which forms a hollow chamber below the diaphragm and the upper cylindrical casting 94 which forms a hollow chamber above the diaphragm. The two castings 72 and 94 are provided with flanges 96 and 98 through which bolts such as 100 and 102, Fig. 2, extend to clamp the edge of the diaphragm therebetween.

The diaphragm 90 divides the hollow chamber formed by the lower bell-shaped casting 72 and the upper cylindrical casting 94 into two chambers with the space below the diaphragm being shown at 110 and the space above the diaphragm at 112. To close the hollow space above the diaphragm a circular plate 111 is bolted to the top edge of the cylindrical casting such as by bolts 113 and 115. The space 112 above the diaphragm is vented such as by opening 114 to permit the air to escape when the diaphragm moves upwardly from the position of Fig. 1 to the position of Fig. 2 or to the extreme position of Fig. 4.

The circular plate 111 is larger than the hollow cylindrical casting 94 so that an edge 117 projects beyond the edge of the casting. This plate 111 supports the assembled apparatus from a frame 119. The apparatus is secured to the frame by an annular ring 121 which clamps the edge 117 of the plate 111 against the frame 119 and the ring is held to the frame by bolts 123 and 125 projecting downwardly through holes in the frame and threaded into holes in the ring 121.

When the piston rod 58 moves upwardly it lifts the mushroom-shaped plate 92 at the upper end of the piston rod to lift the diaphragm 90 within the lower space 110, Fig. 2. A flanged disc 116, Fig. 1, rests on top of the diaphragm 90 and is connected to the lower end of an elevator rod 118. To connect the elevator rod 118 to the disc 116, the disc has an opening 127 at its center hub 129 through which extends a bolt 120. This bolt is threaded into a hole in the end of the elevator rod 118 to hold the disc 116 to the rod. A flanged bushing 183 is positioned between the end of the elevator rod 118 and the hub 129. A coil compression spring 122 is positioned between the disc 116 and the circular plate 111. This compression spring continually urges the disc 116 downwardly and moves it down when the diaphragm 90 is released.

The disc 116 is cup shaped with a flange 131 around the outer edge so that it will present a rounded edge to the diaphragm 90 in the lowered position of Fig. 1.

As the piston rod 50 moves upwardly to push upwardly on the diaphragm 90 the diaphragm is lifted which lifts the disc 116 and the elevator rod 118. The elevator rod is slideably journaled in the plate 111 and is connected at its upper end to a lower crossbar 124. The lower crossbar 124 or T-bar is connected at its center to the elevator rod 118 and its ends are connected to the crimper operating posts 126 and 128. The lower ends of the posts are slideably journaled in bearings 130 and 132 in the plate 111 and guide the elevating movement of the elevator assembly.

The upper ends of the posts are connected to an upper crossbar 133. The assembly of the upper crossbar 133, and the elevator plate 46 is supported on the lower crossbar 124. The elevator plate rests on top of the compression springs 146 and 148 which surround the posts 126 and 128. These compression springs rest at their lower end on the lower crossbar 124 and support the elevator plate 46. The elevator plate 46 pushes upwardly on the spacer collars 134 and 136, Figs. 1 and 2, which are positioned between the elevator plate 46 and the upper bar 133. These spacer collars surround the rods 138 and 140 which carry the pivotal crimping fingers at their upper ends. The upper bar 133 is secured to the posts 126 and 128 and as the force of the springs 146 and 148 pushes upwardly it lifts the posts which are prevented from sliding upwardly by being locked to the lower crossbar 124. For this purpose snap rings such as 137 and 135 are slid into annular grooves in the posts 126 and 128. The springs pushing upwardly on the plate 46 force it tightly against the spacer collars 134 and 136 which push against the upper bar 133 which in turn pulls upwardly on the posts 126 and 128 secured to the lower bar 124 to form a temporary rigid assembly.

Thus when the elevator rod 118 moves upwardly, it lifts upwardly on the lower crossbar 124. The crossbar lifts the compression springs 146 and 148 which are pressing tightly against the elevator plate 146. This plate 46 is pressed upwardly against the spacer collars 134 and 136 which push against the upper crossbar 133, which is secured at its ends to the posts 126 and 128. Thus, as the lifting rod 118 moves up or down between its lowermost position and the first raised position of Fig. 1, the plate 46, which carries the support member 38 and which also carries the rods 138 and 140, moves upwardly to move the support and the crimping mechanism into the position of Fig. 2.

The elevator assembly is lifted by admitting air to the lower end of the cylinder 52. The piston rod will raise until the stop nut 60 strikes the end 66 of cylinder. To be certain that the elevator assembly will not bounce upwardly or overtravel, a separate stop is provided for the elevator plate 46.

This stop, as best shown in Figs. 2 and 4, consists of a guide rod 198 which is secured to the circular plate 111 to extend upwardly. The rod 198 passes through a hole in the elevator plate 46 and carries an adjustable stop nut 194 and a lock nut 196 at the top. When the elevator plate is raised, it is stopped when it strikes the stop nut 194. By adjusting the stop nut the upper position of the elevator plate 46 can be adjusted which will of course adjust the position of the circuit board support 38.

The lifting of the elevator assembly to the first position occurs in the first phase of operation and the parts will remain in the elevated position until the leads of the component have been inserted into the board. After they have been inserted into the board and their insertion has been sensed by the sensing plungers 44 and 45, the crimpers will be operated to bend over the leads beneath the board in the manner shown in Fig. 4.

The insertion of the leads 16 and 18 into the holes 20 and 22 occurs between Fig. 2 and Fig. 3. When the leads are inserted into the holes, the ends engage the enlarged upper ends 154 and 156 of the sensor rods 44 and 45, Fig. 3. As is illustrated in Figs. 2 and 3, the sensor rod is mounted coaxially within the hollow bore of the crimper support rods 138 and 140.

These support rods 138 and 140 are supported in the elevator plate 46 and are secured thereto. The rods, as is pictured in Figs. 3 and 4, are firmly set in the elevator plate 46 such as by a shrink fit or by being threaded into the plate. Thus when the elevator plate 46 is moved into the first lift position of Fig. 2 and is stopped by the stop nut 194 to fix its uppermost position, the uppermost position of the support rods 138 and 140 is also fixed.

Beneath the elevator plate 46 is supported a switch box 160 which contains contacts operated by the sensor plungers 44 and 45.

The switch box 160, as is illustrated in Figs. 2 and 4 contains a lower fixed contact 162 and an upper movable contact 164. Separate switches are provided for each sensor 44 and 45. The lower ends of the sensor plunger 44 or 45 push down on the upper contacts to close the switch contacts when they are depressed. As is shown in Figs. 2 and 3, the sensor plunger 44 has an enlarged head 156 whcih is engaged by the lead 18 when it is pushed through the hole in the circuit board 12. When this occurs the sensor plunger 152 is depressed and its lower end pushes downwardly on the movable contact 164 until it closes or engages the contact 162 to complete the circuit. The circuit is completed through leads leading out through conduit 166. When this circuit is completed the machine can continue operation but if the circuit is not completed due to the fact that a lead is not inserted into a hole and the sensor plunger is not depressed, the machine will be stopped in known manner as described below.

With the leads thus properly inserted into the holes and the sensor plungers 44 and 45 depressed, the machine will continue operation by bending over the ends of the leads beneath the board. To accomplish this, the pivotal crimping fingers are operated. The crimping fingers, as shown in detail in Fig. 5 at 168, have a pair of legs 170 and 172 which straddle the supporting rods 138 and 140. Each of the legs contains a hole as shown by the hole 174 through which extends a pin 175 as shown in Fig. 4 to pivotally connect the crimping finger to the rod. Extending across the two legs 170 and 172 of the crimping finger is a bar 176 having a rounded upper surface which engages the lead of the component to bend it.

The legs 170 and 172 of the crimper are so shaped as to form an offset heel portion such as is shown at 178 and 180. To cause the individual fingers to pivot and crimp the leads, a crimping sleeve 182 and 184 is lifted upwardly to engage this heel portion 178 and 180 of the crimping finger and cause it to pivot upwardly from the position of Fig. 3 to the position of Fig. 4. Since the base portion is located at one side of the supporting shaft 138, the sleeve 182 which rises up to pivot the pivot finger is cut away on the forward side such as shown at 186 on the sleeve 182 and such as is shown at 188 on the sleeve 184 in Fig. 4.

To raise the sleeve and cause the pivotal crimping fingers 168 and 169 to pivot upwardly and crimp the leads, the upper crossbar 133 is lifted upwardly relative to the elevator plate 46. As is shown in Figs. 2 and 3, the crimper operating sleeves are connected to the crossbar 133. To connect the crossbar 133 to the sleeve 182, a pair of snap rings 190 and 192 snap into grooves in the sleeve above and below the crosbar 133 thus locking the sleeve to the bar.

The crossbar 133 is first raised with the elevator plate 46 when the elevator is moved to its first elevated position in the movement that occurs in Fig. 1 to Fig. 2. The crimping members will not pivot in this movement, however, since the supporting rods 138 and 140 which support the crimping fingers are also raised and there is no relative movement between the sleeve and the rod.

When the elevator plate 46 which supports the rods 138 and 140 is stopped and no longer moves upwardly, the lower crossbar 124 continues to move upwardly to lift the upper bar 133 and the sleeves 184 and 182, the crimping fingers will be pivoted since the upper end of the sleeves will push upwardly on the base of the crimping fingers. Movement of the plate 46 is arrested by the stop nut 194 which is threaded to the top of the guide rod 198 which projects through a hole in the plate.

With reference to Fig. 1, it may be seen that when the further upward movement of the plate 46 is terminated, if the lower crossbar 124 is raised further the springs 146 and 148 must compress. If these springs are to compress, the posts 126 and 128 which are secured to the lower crossbar 124 will be raised upwardly to slide through the elevator plate 46. This, of course, raises the upper crossbar 133 which moves the crimping sleeves 182 and 184 upwardly. Since the crimping finger supporting rods 138 and 140 are carried on the elevator plate 46 which moves no further upwardly the sleeves will be slid relatively upwardly on the support rods 138 and 140 and will casue the crimping fingers to pivot to bend the leads in the manner shown in Fig. 4.

To raise the lower crossbar 124 to the second elevated position, air is admitted beneath the diaphragm 90 to raise the elevator rod 118. To raise the diaphragm, air is inserted through the line 88 to pressurize the chamber within the space 110 in the lower casting. As this space is pressurized, the flexible diaphragm 90 is forced upwardly to lift the disc 116, thus lifting the elevator rod 118. Although the chamber 110 is filled with pressurized air, the amount that the disc 116 will raise is controlled by an adjustable stop bolt 199, and the disc will strike the bolt to limit the amount the bolt is raised, as illustrated in Fig. 4. This bolt is threaded into an upper plate portion 200 of a casting 94.

Thus as air is admitted to the line 88, the diaphragm 90 is flexed upwardly to raise the elevator rod 118 and the T-bar 124 which moves the sleeves 182 and 184 upwardly to pivot the crimping fingers.

On the return motion, air is first let out of the chamber 110 beneath the diaphragm 90 and the T-bar 124 and the cross bar 133 will drop downwardly. This action is aided by the compression springs 146 and 148. This will move the sleeves downwardly to permit the crimping fingers to pivot back to the return position of Figs. 2 and 3. Before this has happened, the leads have of course been crimped. When the crimping fingers are returned to this position, the lower line 54 leading to the cylinder 52 is vented and pressurized air admitted at 56, thus returning the elevator to its return position of Fig. 1. This draws the support 38 and the crimping and sensing members to their return position. Since the leads have been crimped beneath the board, the board can then be moved on to bring a new board into position. In order that this may occur, of course, the inserting fingers 26 and 28 are raised to their return position. For inserting a new component into the board, the fingers prepare another component by bending the leads downwardly to the board and the mechanism with a new board will assume the same appearance as is shown in Fig. 1.

As previously stated, the mechanism for bending and inserting the leads may be of the type shown in the co-pending applicaiton, Machine for Assembling Circuit Components, Bergsland et al., and if the present mechanism is used in such a machine the crimper can be kept in synchronism by the cam shaft 84, Fig. 6, being driven by the main drive motor of the mechanism or even by the crimping mechanism being supplied with air from the same controlled source as the inserting mechanism. Also the switches which are operated by the plungers 44 and 45 may be incorporated in the circuit shown in said co-pending application in place of the safety switches shown, or may be arranged to stop the machine in any practical circuit arrangement which is desired.

Thus it will be seen that we have provided an improved mechanism which greatly facilitates the attachment of a component to a circuit board. A simple elevating mechanism has been provided which functions to move a board support, a crimping mechanism, and a sensing mechanism into operating position with one simple action. With these members in their position, the board is supported so that the leads may be checked through the holes in the board, the sensor mechanisms sense whether the lead has been properly inserted into the board, and the crimping mechanism operates.

Additional mechanism has been provided to operate the crimping fingers and these operate with certain of the parts that are common to the elevating apparatus. With the mechanism illustrated in the preferred embodiment, a single element is used for both the elevational apparatus and the crimping mechanism, both working off a simple pneumatic operational device.

Although the mechanism is shown operated from an air supply such as illustrated in Fig. 6, it will be understood that other operating devices can be adopted.

I claim as my invention:

1. A mechanism for attaching electrical components to circuit boards comprising a board support member adapted to be moved up to the lower surface of the circuit board to prevent it from being displaced downwardly when the leads of the component are inserted into holes in the board, a crimper for bending the ends of the component leads after they have been inserted through the holes in the circuit board, an elevator mechanism connected to the support member and the crimper, first elevator lifting means raising the elevator until the support is beneath the circuit board, means to stop the upward movement of the elevator at a first stopping position when the support is beneath the circuit board, second elevator lifting means adapted to move upwardly and raise the elevator from the first stopping position to a second stopping position, and crimper operating means connected between the crimper and the elevator and adapted to cause the crimpers to bend the leads against the under surface of the circuit board during the travel of the elevator from the first to the second stopping position.

2. A mechanism for attaching electrical components to circuit boards comprising a board support member adapted to be lifted up beneath the board and held there against while the leads are inserted into the holes in the circuit board to prevent the board from being deflected downwardly, a crimping member adapted to move against the leads and bend them against the under surface of the circuit board, an elevator mechanism connected to the board support and the crimping member, the elevator adapted to be moved upwardly to a first position where the support member is against the circuit board and subsequently to a second position, means operating the crimping member when the elevator is moved to the second position, an air chamber, a diaphragm placed over an air chamber and supporting the elevator, a piston rod engaging the diaphragm to raise the elevator to the first position, and means admitting air beneath the diaphragm after the elevator has reached the first position to lift the diaphragm and elevator to said second position to operate the crimping member.

3. A mechanism for attaching electrical components to circuit boards comprising a support which may be positioned beneath the lower surface of a circuit board to prevent vertical displacement when the leads of the component are being inserted into holes in the circuit board, a crimping mechanism which may be positioned beneath the board to crimp the leads of the component as they are inserted into holes in the board, an elevator mechanism carrying the support and crimping mechanism, a sensor mechanism supported on the elevator and moved into position therewith to be engaged by the leads of the component as they are inserted into holes in the board, a switch member connected to said sensor mechanism to be operated when the sensor mechanism is engaged by the leads to determine the crimping of said leads, means to lift the elevator to a first position where the support means, crimper, and sensor are in operative position beneath the board, means to lift the elevator to a second position after the leads of the component have been inserted through the holes in the board, and crimper operating mechanism connected between the elevator and the crimper and adapted to operate the crimpers when the elevator is lifted to the second position.

4. A mechanism for attaching electrical components to circuit boards comprising means to insert the leads of an electrical component into holes on the upper surface of the circuit board, a lead crimping mechanism adapted to be lifted into position beneath the circuit board for crimping the leads, an elevator for supporting the lead crimping mechanism and moveable to lift the crimping mechanism into crimping position, means for operating the crimpers after the leads have been inserted through the holes in the board, lead sensing elements for sensing the complete insertion of the component leads, the elements supported on the elevator being lifted into position beneath the circuit board opposite the holes in the circuit board when the crimpers are lifted so that the lead sensing elements will be engaged by the leads as they pass through the holes in the boards, and switching means adapted to be engaged by the sensing elements for actuating said crimper operating means, whereby failure of said leads to engage said lead sensing elements prevents the operation of said crimpers.

5. A mechanism for attaching electrical components to circuit boards comprising guide means for supporting a board in component attaching position, a crimping finger positioned beneath the board, a rod pivotally supporting the crimping finger at the upper end, a sensing member positioned at the upper end of the rod and adapted to be engaged by the component lead as it is inserted into the hole in the board, a tubular sleeve surrounding the rod and adapted to be moved axially along the rod to operate the crimping finger to crimp the lead against the bottom of the board, the crimping finger having a pair of legs which straddle the axial rod and are pivotally connected thereto to permit the sensing member to be exposed to the component leads between said straddling legs of the finger, a switch member connected to said sensing member to be operated when the upper end of the sensing member is engaged by the component lead, and means to move the sleeve upwardly in response to the activation of said switch means to pivot the crimping finger and bend the leads against the bottom of the board.

References Cited in the file of this patent

UNITED STATES PATENTS

| | | |
|---|---|---|
| 603,438 | Zwissler | May 3, 1898 |
| 2,746,041 | Heeley | May 22, 1956 |
| 2,758,303 | Dow et al. | Aug. 14, 1956 |